(12) United States Patent
Lee (10) Patent No.: US 12,237,205 B2
(45) Date of Patent: Feb. 25, 2025

(54) SUBSTRATE SUPPORT ASSEMBLY FOR SUBSTRATE TREATMENT APPARATUS

(71) Applicant: DEVICEENG CO. LTD, Chungcheongnam-do (KR)

(72) Inventor: Taek Youb Lee, Chungcheongnam-do (KR)

(73) Assignee: Deviceeng Co. Ltd, Chungcheongnam-do (KR)

( * ) Notice: Subject to any disclaimer, the term of this patent is extended or adjusted under 35 U.S.C. 154(b) by 380 days.

(21) Appl. No.: 17/562,593

(22) Filed: Dec. 27, 2021

(65) Prior Publication Data

US 2023/0062042 A1 Mar. 2, 2023

(30) Foreign Application Priority Data

Aug. 24, 2021 (KR) .................. 10-2021-0111355

(51) Int. Cl.
*H01L 21/68* (2006.01)
*H01L 21/687* (2006.01)

(52) U.S. Cl.
CPC .... *H01L 21/68764* (2013.01); *H01L 21/6875* (2013.01); *H01L 21/68792* (2013.01)

(58) Field of Classification Search
CPC ......... H01L 21/67051; H01L 21/68714; H01L 21/68728; H01L 21/68785
See application file for complete search history.

(56) References Cited

U.S. PATENT DOCUMENTS

| | | | |
|---|---|---|---|
| 8,714,169 B2 | 5/2014 | Lee et al. | |
| 9,421,617 B2 * | 8/2016 | Goodman | B23B 31/1261 |
| 10,286,425 B2 | 5/2019 | Sasaki et al. | |
| 11,410,863 B2 | 8/2022 | Shimai et al. | |
| 2002/0078889 A1 | 6/2002 | Welch et al. | |
| 2004/0007257 A1 | 1/2004 | Park | |
| 2004/0132318 A1 | 7/2004 | Kim et al. | |
| 2010/0126539 A1 * | 5/2010 | Lee | H01L 21/68785 |
| | | | 134/157 |

(Continued)

FOREIGN PATENT DOCUMENTS

| | | | |
|---|---|---|---|
| JP | H10-209254 A | * | 8/1998 |
| JP | 3271113 B2 | | 4/2002 |

(Continued)

OTHER PUBLICATIONS

Machine Translation of Matsushita, JP H10-209254A, Aug. 1998. (Year: 1998).*

*Primary Examiner* — David G Cormier
(74) *Attorney, Agent, or Firm* — BLANK ROME LLP (57) ABSTRACT

The present invention relates to a substrate support assembly for a substrate treatment apparatus, including: a chuck base disposed opposite to a substrate when the substrate is installed, rotatable around a rotating shaft, and having an installation accommodation portion formed in the lower portion near the outer peripheral surface thereof in a circumferential direction thereof; chuck pins disposed on top of the chuck base and movable along directions away from and approaching the substrate; a mechanism unit disposed in the installation accommodation portion and connected to the chuck pins to move the chuck pins; and a driving unit for transmitting power to the mechanism unit.

17 Claims, 11 Drawing Sheets

(56) References Cited

U.S. PATENT DOCUMENTS

| | | | |
|---|---|---|---|
| 2010/0130020 A1* | 5/2010 | Kim | H01L 21/68728 156/345.23 |
| 2011/0034034 A1* | 2/2011 | Du Bois | B05C 13/00 438/758 |
| 2013/0319472 A1 | 12/2013 | Frank et al. | |
| 2022/0172979 A1* | 6/2022 | Tonai | H01L 21/68757 |
| 2023/0163018 A1* | 5/2023 | Satou | H01L 21/683 269/20 |
| 2023/0264232 A1 | 8/2023 | Lee | |

FOREIGN PATENT DOCUMENTS

| | | |
|---|---|---|
| KR | 1020060024537 A | 3/2006 |
| KR | 20080030203 A | 4/2008 |
| KR | 20100001152 U | 2/2010 |
| KR | 101145775 B1 | 5/2012 |
| TW | 202013595 A | 4/2020 |
| WO | 2014074861 A1 | 5/2014 |

* cited by examiner

SUBSTRATE SUPPORT ASSEMBLY FOR SUBSTRATE TREATMENT APPARATUS

CROSS REFERENCE TO RELATED APPLICATION OF THE INVENTION

The present application claims the benefit of Korean Patent Application No. 10-2021-0111355 filed in the Korean Intellectual Property Office on Aug. 24, 2021, the entire contents of which are incorporated herein by reference.

BACKGROUND OF THE INVENTION

Field of the Invention

The present invention relates to a substrate support assembly for a substrate treatment apparatus, and more specifically, to a substrate support assembly for a substrate treatment apparatus that is capable of rotating a substrate in a state of supporting the substrate so as to perform semiconductor fabrication processes such as cleaning, drying, and the like.

Background of the Related Art

Generally, a semiconductor device is manufactured by depositing and patterning various materials on a substrate to the shape of thin films, and in the manufacturing process, different steps such as deposition, photolithography, etching, cleaning, and drying are needed.

Among them, the cleaning and drying processes are performed to remove foreign substances or particles from the substrate and to then dry the substrate. In a state where the substrate is supported on top of a spin head (chuck base), first, a treatment liquid is supplied to top or underside of the substrate, while the spin head is rotating at a high speed.

To prevent the substrate from escaping from the spin head in a lateral direction of the spin head, generally, chuck pins are disposed on the spin head in a circumferential direction of the spin head, and in this case, a substrate support assembly is constituted of the chuck pins, the spin head, mechanism unit, and a driving unit for driving the mechanism unit.

The chuck pins move between holding positions where they hold the substrate onto top of the spin head and releasing positions where they are separated from the substrate.

According to a conventional substrate support assembly, however, a lot of parts such as a mechanism unit connected to chuck pins are provided so that the assembly becomes complicated in structure, and since the lot of parts have to be accommodated inside the assembly, further, an inner space capable of accommodating any other parts except the mechanism unit is not sufficiently ensured, thereby undesirably making the overall volume of the assembly bulky.

According to the conventional substrate support assembly, besides, if it is desired to exchange the chuck pins whose life span is ended with new ones, the top of the spin head should be removed to completely expose the chuck pins to the outside, thereby undesirably requiring many hours and works for the exchange and maintenance of the assembly.

SUMMARY OF THE INVENTION

Accordingly, the present invention has been made in view of the above-mentioned problems occurring in the related art, and it is an object of the present invention to provide a substrate support assembly for a substrate treatment apparatus that is capable of allowing a mechanism unit for moving chuck pins to be intensively disposed around the outer peripheral surface of a chuck base, providing a sufficient space portion at the insides of the mechanism unit, in which a plurality of parts for performing various functions can be compactedly built, and performing the exchange and maintenance for the chuck pins easily and rapidly to thus prevent the reduction of productivity thereof.

To accomplish the above-mentioned objects, according to the present invention, there is provided a substrate support assembly for a substrate treatment apparatus, including: a chuck base disposed opposite to a substrate when the substrate is installed, rotatable around a rotating shaft, and having an installation accommodation portion formed in the lower portion near the outer peripheral surface thereof in a circumferential direction thereof; chuck pins disposed on top of the chuck base and movable along directions away from and approaching the substrate; a mechanism unit disposed in the installation accommodation portion and connected to the chuck pins to move the chuck pins; and a driving unit for transmitting power to the mechanism unit.

According to the present invention, desirably, the width of the installation accommodation portion in a radial direction of the substrate may be set within the range of ⅕ to ⅓ of the radius of the substrate.

According to the present invention, desirably, two or more sets of assemblies each having the chuck pin, the mechanism unit, and the driving unit may be equally spaced apart from one another around the rotating shaft.

According to the present invention, desirably, the mechanism unit may include: a first operating piece returnably movable in a direction of the rotating shaft by means of the driving unit; and a second operating piece having one side coming into contact with the first operating piece along a longitudinal direction thereof, allowing the chuck pin to be disposed on the other side thereof, and returnably moving around a hinge shaft disposed on the chuck base between one side and the other side thereof.

According to the present invention, desirably, the second operating piece may have a slant surface formed on the underside of one side coming into contact with the first operating piece, and as the first operating piece moves up in the direction of the rotating shaft, the second operating piece may move around the hinge shaft.

According to the present invention, desirably, between the first operating piece and the chuck base is disposed a first spring applying a restoring force or a first magnet applying a magnetic force in the direction away from each other along the rotating shaft, and between the second operating piece and the chuck base is disposed a second spring applying a restoring force or a second magnet applying a magnetic force so that the chuck pin moves to a holding position.

According to the present invention, desirably, a portion of the second operating piece, which is oriented toward the chuck pin from the hinge shaft, is located above a portion of the second operating piece, which is oriented toward the first operating piece from the hinge shaft, and the portion oriented toward the chuck pin is separated from the portion oriented toward the first operating piece in an up and down direction by means of a separation wall.

According to the present invention, desirably, in a plan view, the second operating piece is extended to the shape of an arch along the circumferential direction of the chuck base.

According to the present invention, desirably, the first operating piece is movable up and down along two guide rods disposed vertically in the installation accommodation portion, and any one of the two guide rods is surrounded with the first spring.

According to the present invention, desirably, the chuck pins, the second operating pieces, a conductive medium constituting the chuck base, and a motor for rotating the chuck base are electrically connected to one another.

According to the present invention, desirably, the chuck base has checkup holes formed along the outer peripheral surface thereof to allow the portion oriented toward the chuck pin to be exposed to the outside.

According to the present invention, desirably, a weight of the portion oriented toward the first operating piece is greater than a weight of the portion oriented toward the chuck pin.

According to the present invention, desirably, the portion of the second operating piece oriented toward the first operating piece may have an auxiliary weight attached thereto with a higher density than the second operating piece, and the sum of the weight of the portion oriented toward the first operating piece and the weight of the auxiliary weight may be larger than the weight of the portion oriented toward the chuck pin.

According to the present invention, desirably, inside the installation accommodation portion or on the separation wall is disposed a stopper opposed laterally to the portion oriented toward the chuck pin inside the chuck base in the radial direction of the chuck base.

According to the present invention, desirably, on the chuck base or the separation wall is disposed a stopper opposed laterally to the portion oriented toward the chuck pin in the radial direction of the chuck base.

According to the present invention, desirably, the driving unit may include: a pusher coming into contact with the mechanism unit; and a driver connected to the pusher.

According to the present invention, desirably, the first operating piece may have a connection groove formed on the underside thereof, and the pusher may have an operating protrusion protruding from top thereof and coupled to the connection groove of the first operating piece.

According to the present invention, desirably, the driver may include: a support frame with the plurality of pushers disposed thereon in the circumferential direction thereof; a pressurizing rod connected to the support frame and spaced apart from the pusher inwardly; and a driving source spaced apart from the pusher inwardly and connected to the pressurizing rod, and between the pusher and the pressurizing rod is disposed a curtain wall.

According to the present invention, desirably, the driving source is hermetically encased by a housing and connected to the pressurizing rod through top of the housing.

BRIEF DESCRIPTION OF THE DRAWINGS

The above and other objects, features and advantages of the present invention will be apparent from the following detailed description of the embodiments of the invention in conjunction with the accompanying drawings, in which.

DETAILED DESCRIPTION OF THE PREFERRED EMBODIMENT

Hereinafter, an embodiment of the present invention will be explained in detail with reference to the attached drawings.

Figure 1:
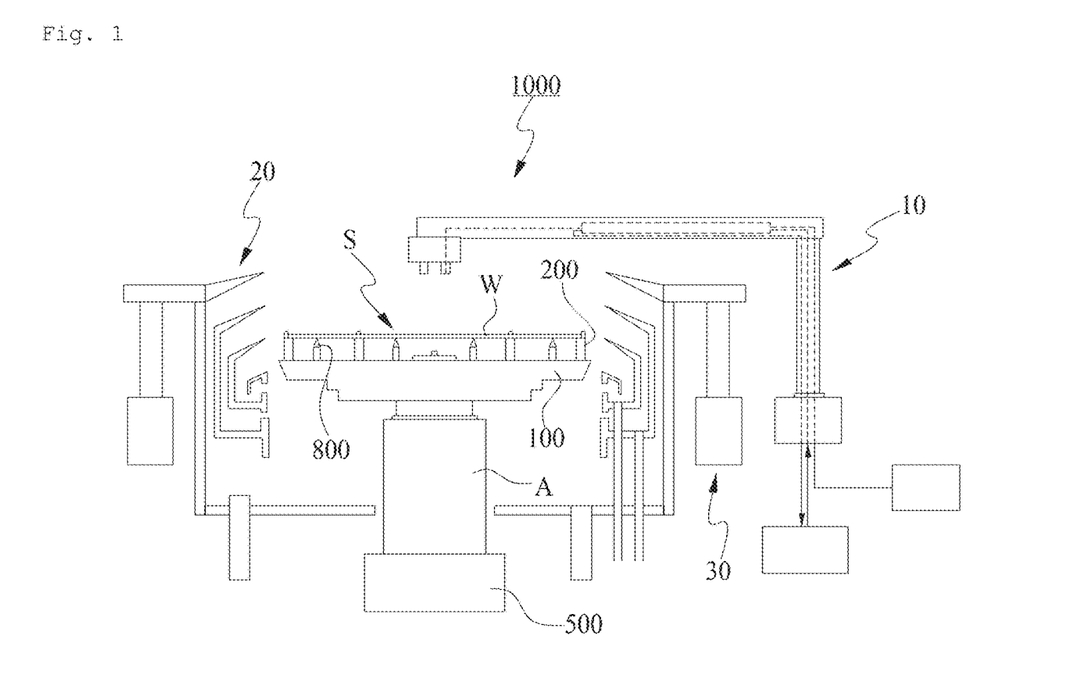
FIG. 1 is a side sectional view showing a substrate treatment apparatus adopted in a substrate support assembly for a substrate treatment apparatus according to the present invention.

As shown in FIG. 1, a substrate treatment apparatus 1000 includes a fluid supply unit 10, a bowl assembly 20, an ascending and descending unit 30, and a substrate support assembly S.

The fluid supply unit 10 supplies substrate treatment fluids such as treatment liquids or gases to a substrate W.

The substrate support assembly S serves to rotate the substrate W in a state of supporting the substrate W, while a given treatment is 0 being carried out.

The bowl assembly 20 serves to receive chemical liquids used for treatments and fumes generated during the treatments to prevent the chemical liquids and fumes from scattering or flowing to the outside and has a stacked structure of bowls so that different kinds of chemical liquids and fumes are separately introduced thereinto according to relative heights of the bowls to the substrate W.

The ascending and descending unit 30 serves to move up and down the substrate support assembly S or the bowl assembly 20 to change a relative height between the bowl assembly 20 and the substrate support assembly S within the bowl assembly 20.

Figure 2:
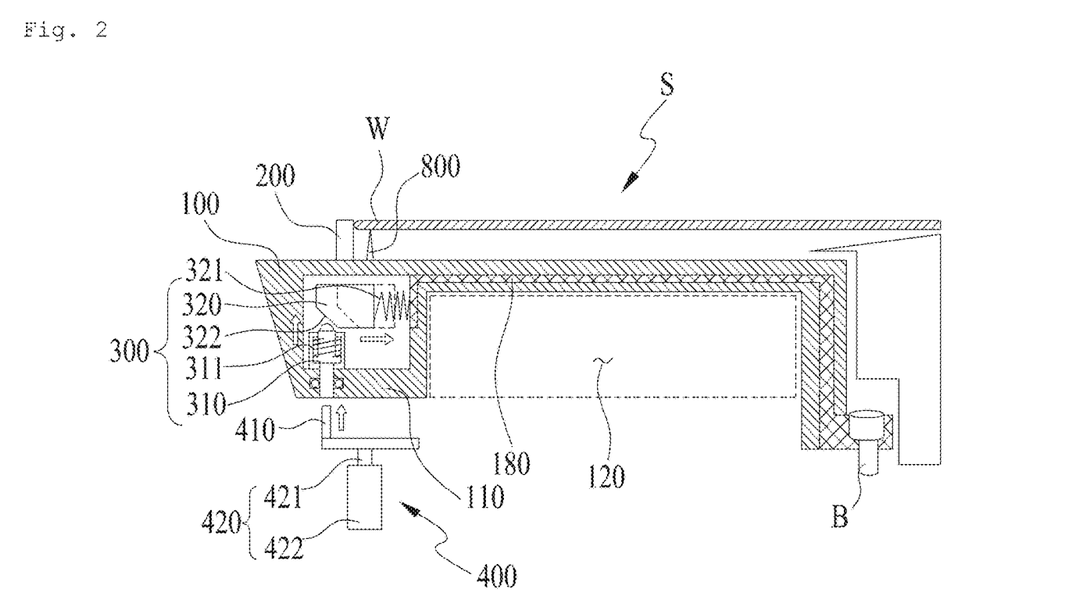
FIG. 2 is a side sectional view showing the substrate support assembly for a substrate treatment apparatus according to the present invention.
Figure 3:
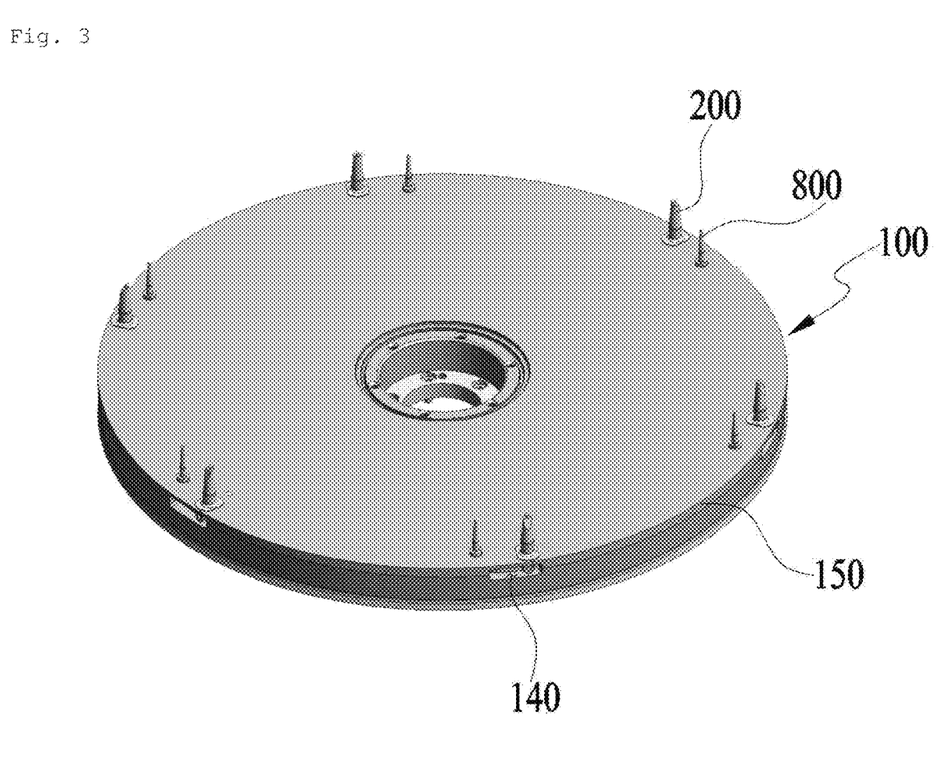
FIG. 3 is a perspective view showing top of a chuck base in the substrate support assembly according to the present invention.
Figure 4:
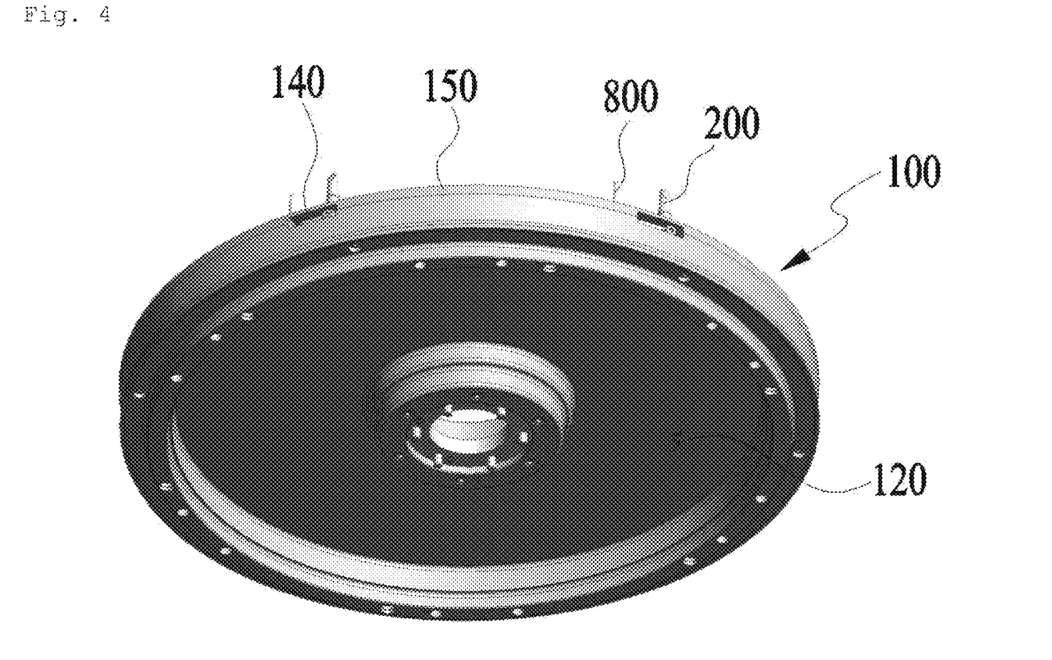
FIG. 4 is a perspective view showing underside of the chuck base in the substrate support assembly according to the present invention.

As shown in FIGS. 2 to 4, the substrate support assembly S includes a chuck base 100 disposed opposite to the substrate W when the substrate W is installed, rotatable around a rotating shaft A, and having an installation accommodation portion 110 formed in the lower portion near the outer peripheral surface thereof in a circumferential direction thereof, chuck pins 200 disposed on top of the chuck base 100 and movable along directions away from and approaching the substrate W, a mechanism unit 300 disposed in the installation accommodation portion 110 and connected to the chuck pins 200 to move the chuck pins 200, and a driving unit 400 for transmitting power to the mechanism unit 300.

Further, the substrate support assembly S includes support pins 800 disposed on top of the chuck base 100 to support the substrate W.

As the mechanism unit 300 is intensively disposed in the installation accommodation portion 110 formed in the lower portion near the outer peripheral surface of the chuck base 100 in the circumferential direction of the chuck base 100, the chuck base 100 has an inner space 120 surrounded by the installation accommodation portion 110, in a plan view.

That is, the inner space 120 has a relatively larger diameter than a width of the installation accommodation portion 110, and accordingly, a plurality of electrical and electronic parts or mechanical parts for performing various functions can be compactedly built in the inner space 120, thereby greatly reducing the overall volume of the substrate treatment apparatus 1000.

In this case, the width of the installation accommodation portion 110 in a radial direction of the substrate W is desirably set within the range of ⅕ to ⅓ of the radius of the substrate W.

In the case where a diameter of the chuck base 100 is determined, if the radial width of the installation accommodation portion 110 is too small, a space in which the mechanism unit 300 are disposed is not sufficiently provided within the installation accommodation portion 110, and contrarily, if the radial width of the installation accommodation portion 110 is too big, the inner space 120 for accommodating various parts is not sufficiently provided.

Figure 5:
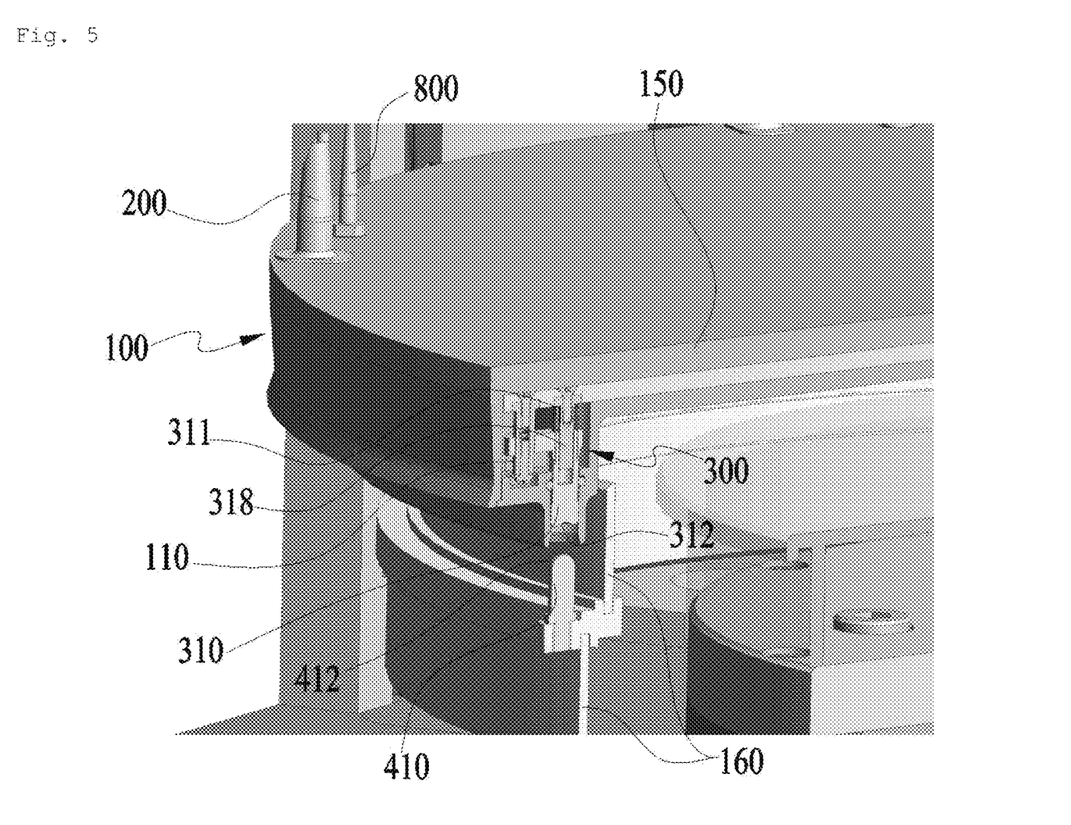
FIG. 5 is a longitudinal sectional view showing main parts of the substrate support assembly according to the present invention.
Figure 6:
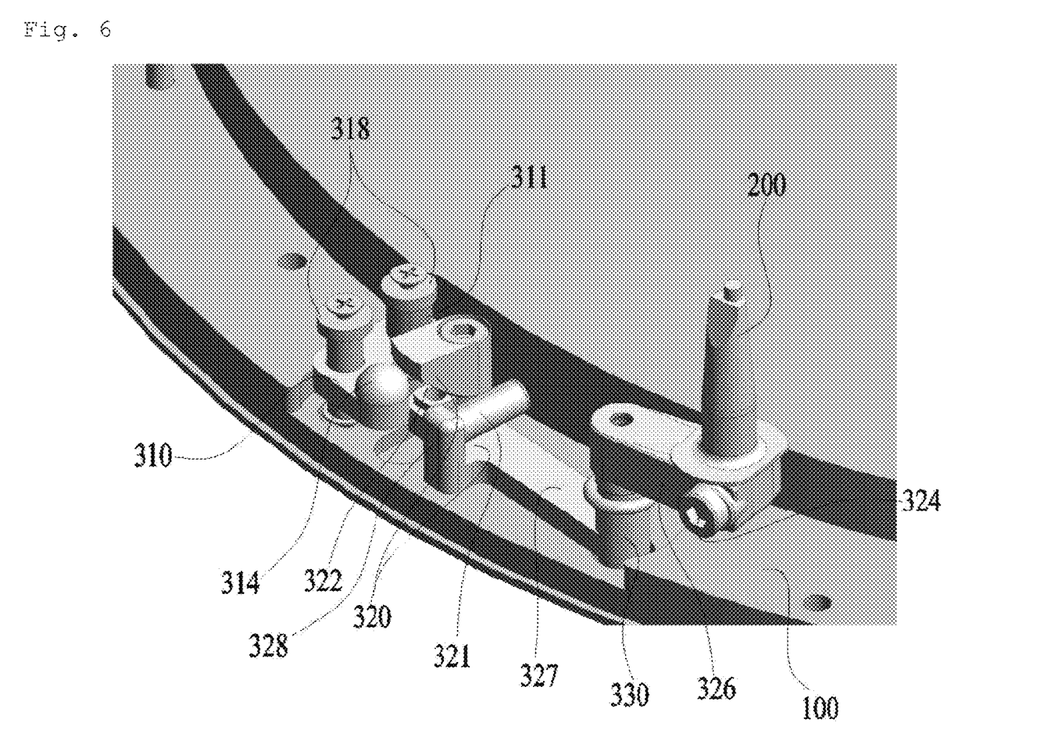
FIG. 6 is a perspective view showing top of a mechanism unit in the substrate support assembly according to the present invention.
Figure 7:
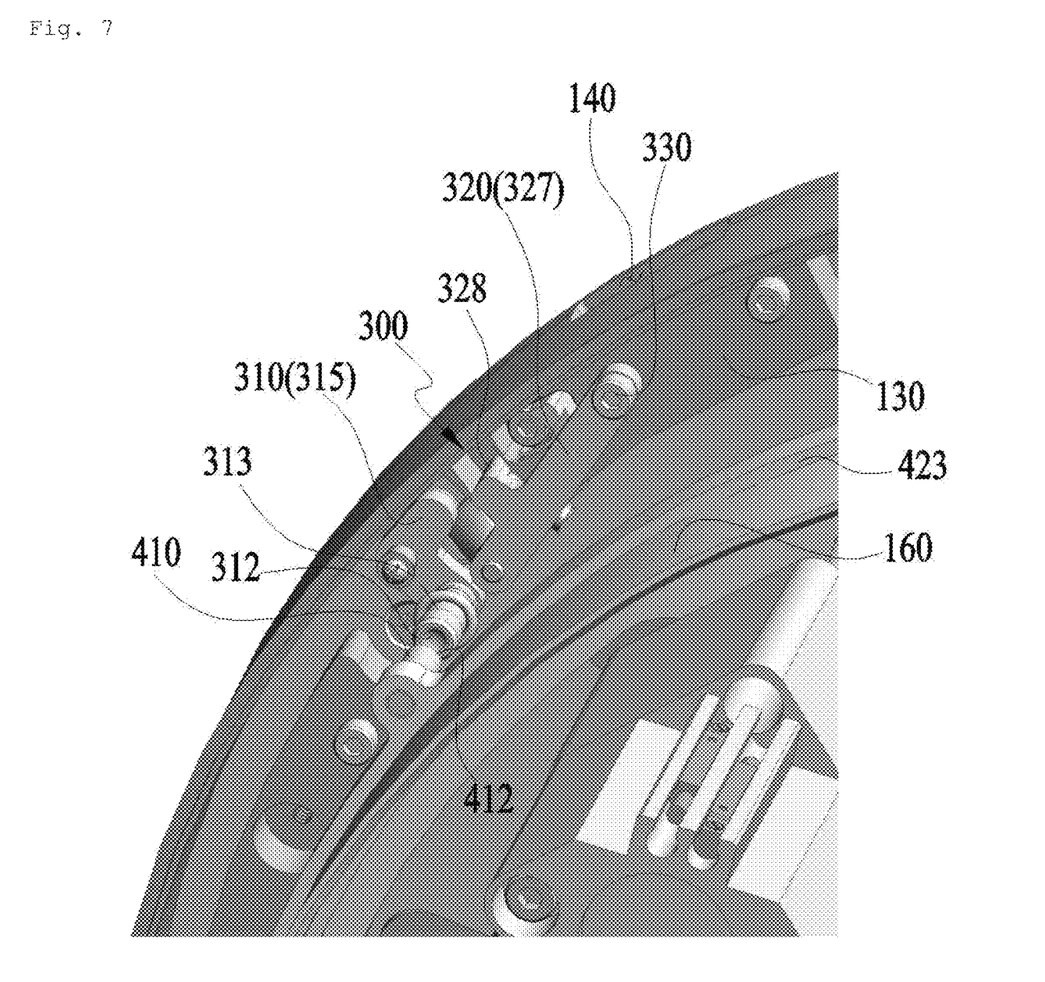
FIG. 7 is a perspective view showing underside of the mechanism unit in the substrate support assembly according to the present invention.

As shown in FIGS. 5 to 7, the mechanism unit 300 includes a first operating piece 310 returnably movable in a direction of the rotating shaft A by means of the driving unit 400 and a second operating piece 320 having one side coming into contact with the first operating piece 310 along a longitudinal direction thereof, allowing the chuck pin 200 to be disposed on the other side thereof, and returnably moving around a hinge shaft 330 disposed on the chuck base 100 between one side and the other side thereof.

The first operating piece 310 is movable up and down along two guide rods 318 disposed vertically in the installation accommodation portion 110.

The hinge shaft 330 is disposed on the second operating piece 320 and rotatably coupled to the chuck base 100, and the technology related to the hinge shaft will be obviously understood to a person having ordinary skill in the art.

Under the above-mentioned configuration, if the driving unit 400 operates to move the first operating piece 310, the second operating piece 320 coming into contact with the first operating piece 310 moves, and accordingly, the chuck pin 200 connected to the second operating piece 320 moves to the direction becoming distant from the substrate W and thus stays at its standby position. Otherwise, the chuck pin 200 moves to the direction approaching the substrate W and thus stays at its holding position.

Under the simple configuration, that is, the chuck pin 200 moves between its standby position and its holding position to minimize the cross-sectional area (volume) of the installation accommodation portion 110.

Figure 8:
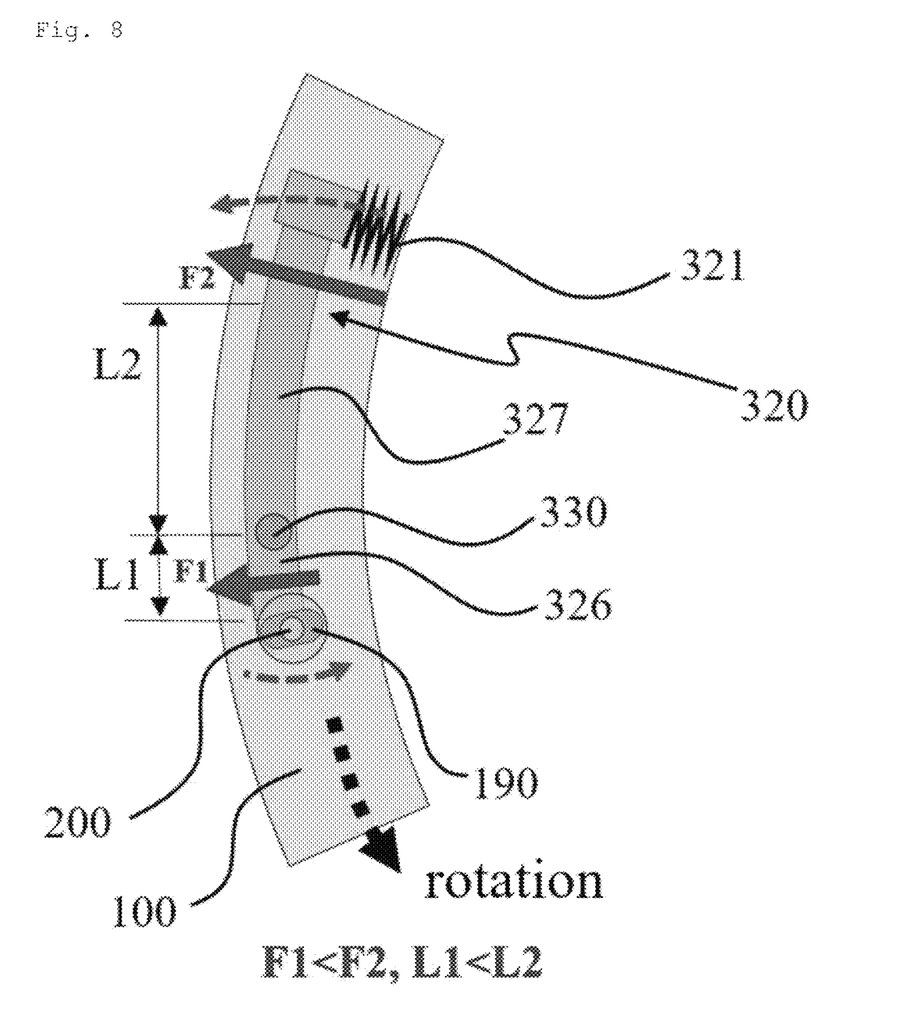
FIG. 8 is a plan view showing an operating structure of a second operating piece of the mechanism unit in the substrate support assembly according to the present invention.

In this case, a guide hole 190 is formed on a top cover 150 of the chuck base 100 to allow the chuck pin 200 to be reciprocated between its standby and holding positions (See FIG. 8).

Further, a slant surface 322 is formed on the underside of one side of the second operating piece 320 coming into contact with the first operating piece 310, and as the first operating piece 310 moves up in the direction of the rotating shaft A, top of the first operating piece 310 pushes the slant surface 322 of the second operating piece 320 to allow the second operating piece 320 to move around the hinge shaft 330.

Moreover, the first operating piece 310 and the second operating piece 320 are returnably movable so that if the driving unit 400 does not operate, the chuck pin 200 is always placed on its holding position.

In specific, a first spring 311 applying a restoring force or a first magnet (not shown) applying a magnetic force is disposed between the first operating piece 310 and the chuck base 100 in the direction away from each other along the rotating shaft A, and a second spring 321 applying a restoring force or a second magnet (not shown) applying a magnetic force is disposed between the second operating piece 320 and the chuck base 100 so that the chuck pin 200 moves to its holding position.

In the drawings, the first spring 311 is a compression spring disposed in up and down directions, and the second spring 321 is a compression spring disposed horizontally. In this case, of course, it is obvious to a person having ordinary skill in the art that the springs may be appropriately changed in their arrangement direction.

Further, a portion 326 of the second operating piece 320, which is oriented toward the chuck pin 200 from the hinge shaft 330, is located above a portion 327 of the second operating piece 320, which is oriented toward the first operating piece 310 from the hinge shaft 330, and the portion 326 oriented toward the chuck pin 320 is separated from the portion 327 oriented toward the first operating piece 310 in an up and down direction by means of a separation wall 130.

Under the above-mentioned configuration, if the top cover 150 of the chuck base 100 is open, the second operating pieces 320 are exposed to the outside, and the first operating pieces 310 are sealed under the separation walls 130. As a result, the exchange and maintenance of the chuck pins 200 can be easily achieved, while the first operating pieces 310 are being not influenced by external environments.

As shown in FIG. 8, in a plan view, the second operating piece 320 is extended to the shape of an arch along the circumferential direction of the chuck base 100 so that when the second operating piece 320 moves around the hinge shaft 330, it does not interfere with the chuck base 100 to the maximum extent.

Further, the chuck base 100 has checkup holes 140 formed along the outer peripheral surface thereof to allow the portions 326 oriented toward the chuck pins 200 to be exposed to the outside, so that the connection states of the chuck pins 200 can be easily checked from the outside.

Referring to FIG. 6, a fastening hole 324 is exposed to the outside through the checkup hole 140, and as a tool such as a wrench is fitted to the fastening hole 324, the chuck pin 200 can be easily separated from the second operating piece 320.

As shown in FIG. 8, desirably, a weight F2 of the portion 327 oriented toward the first operating piece 310 is greater than a weight F1 of the portion 326 oriented toward the chuck pin 200.

Under the above-mentioned configuration, the portion 327 oriented toward the first operating piece 310 has a greater moment than the portion 326 oriented toward the chuck pin 200 from the hinge shaft 330 through the centrifugal force generated during the rotation of the chuck base 100, so that the chuck pin 200 pressurizes the side periphery of the substrate W by means of the application of the centrifugal force to thus allow the substrate W to be more firmly held thereby during the rotation of the chuck base 100.

In specific, a length L2 from the hinge shaft 330 to the center of the weight of the portion 327 oriented toward the first operating piece 310 is longer than a length L1 from the hinge shaft 330 to the portion 326 oriented toward the chuck pin 200, a bigger moment difference may be obtained between the portion 327 oriented toward the first operating piece 310 and the portion 326 oriented toward the chuck pin 200.

Figure 9:
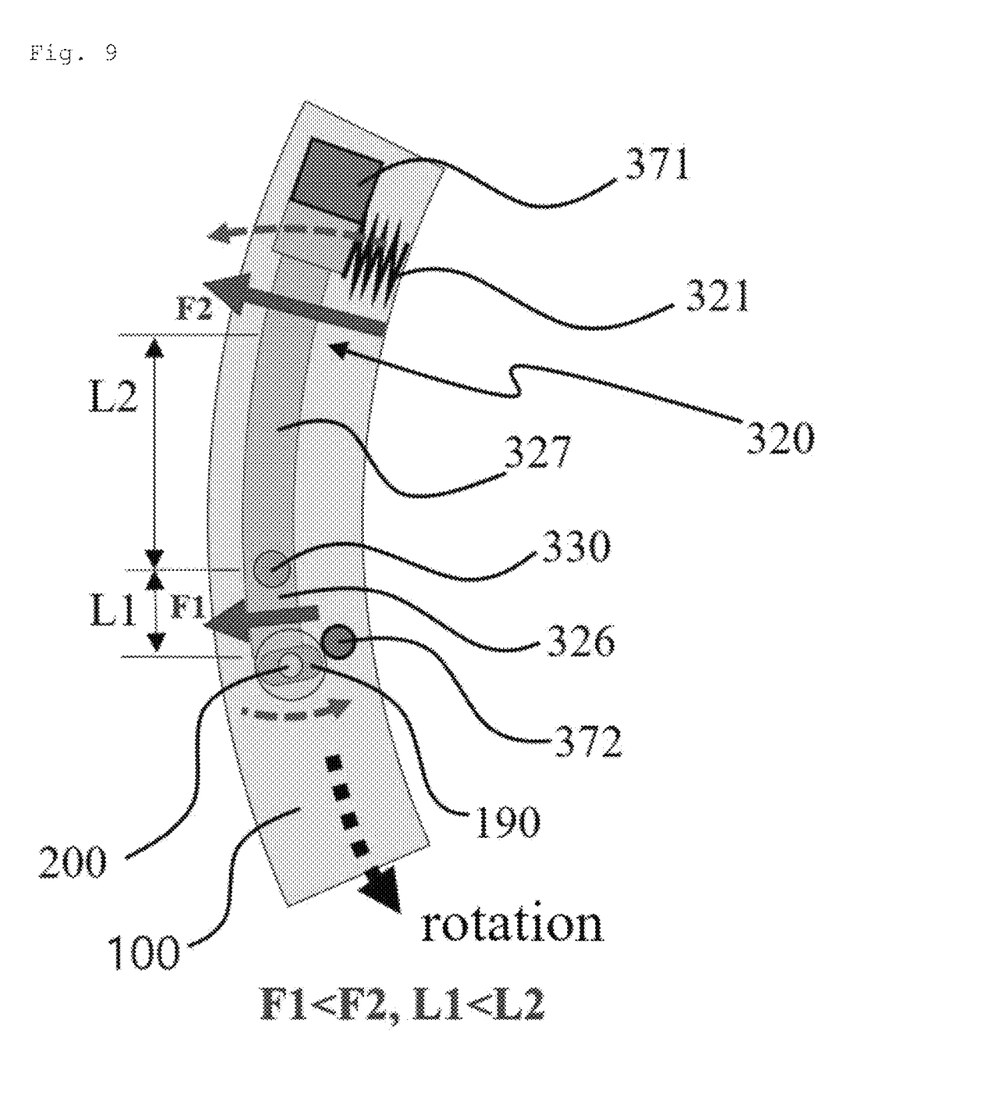
FIG. 9 is a plan view showing an additional example of FIG. 8.

Referring to FIG. 9, further, the portion 327 of the second operating piece 320, which is oriented toward the first operating piece 310, has an auxiliary weight 371 attached thereto with a higher density than the second operating piece 320, and the sum of the weight of the portion 327 oriented toward the first operating piece 310 and the weight of the auxiliary weight 371 is larger than the weight of the portion 326 oriented toward the chuck pin 200, which causes a difference between the centrifugal forces of the portion 327 oriented toward the first operating piece 310 and the portion 326 oriented toward the chuck pin 200.

In this case, the auxiliary weight 371 is disposed on the end of the second operating piece 320 toward the first operating piece 310 to allow a greater moment with respect to the hinge shaft 330 when compared with the same weight to be applied to the portion 327 oriented toward the first operating piece 310.

Further, a stopper 372 is disposed inside the installation accommodation portion 110 or on the separation wall 130 and opposed laterally to the portion 326 oriented toward the chuck pin 200 in the radial direction of the chuck base 100, thereby preventing the chuck pin 200 during the rotation of the chuck base 100 from entering the substrate W due to the excessive centrifugal force to avoid the edge periphery of the substrate W from being damaged.

Figure 10:
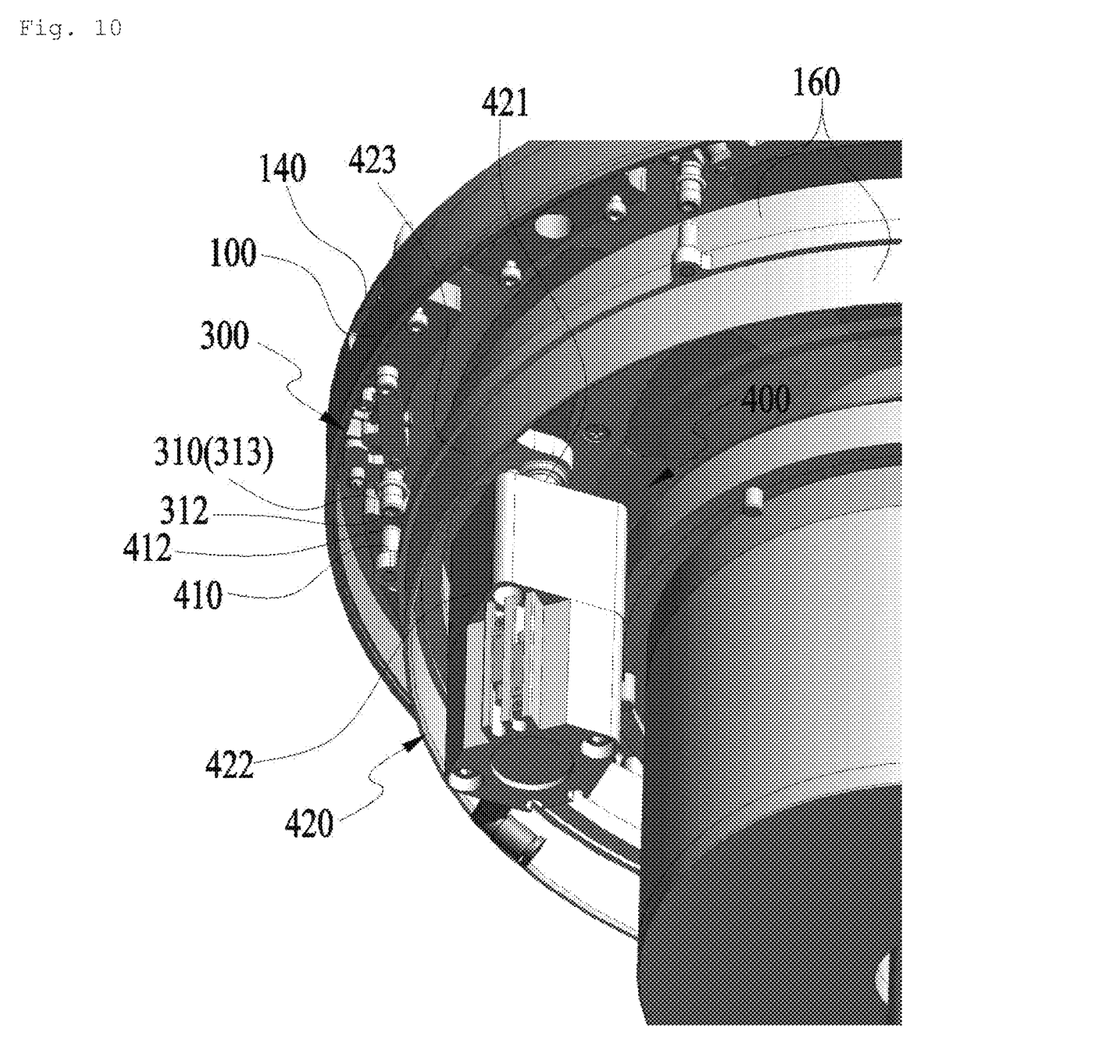
FIG. 10 is a perspective view showing the underside of a portion of the substrate support assembly according to the present invention.
Figure 11:
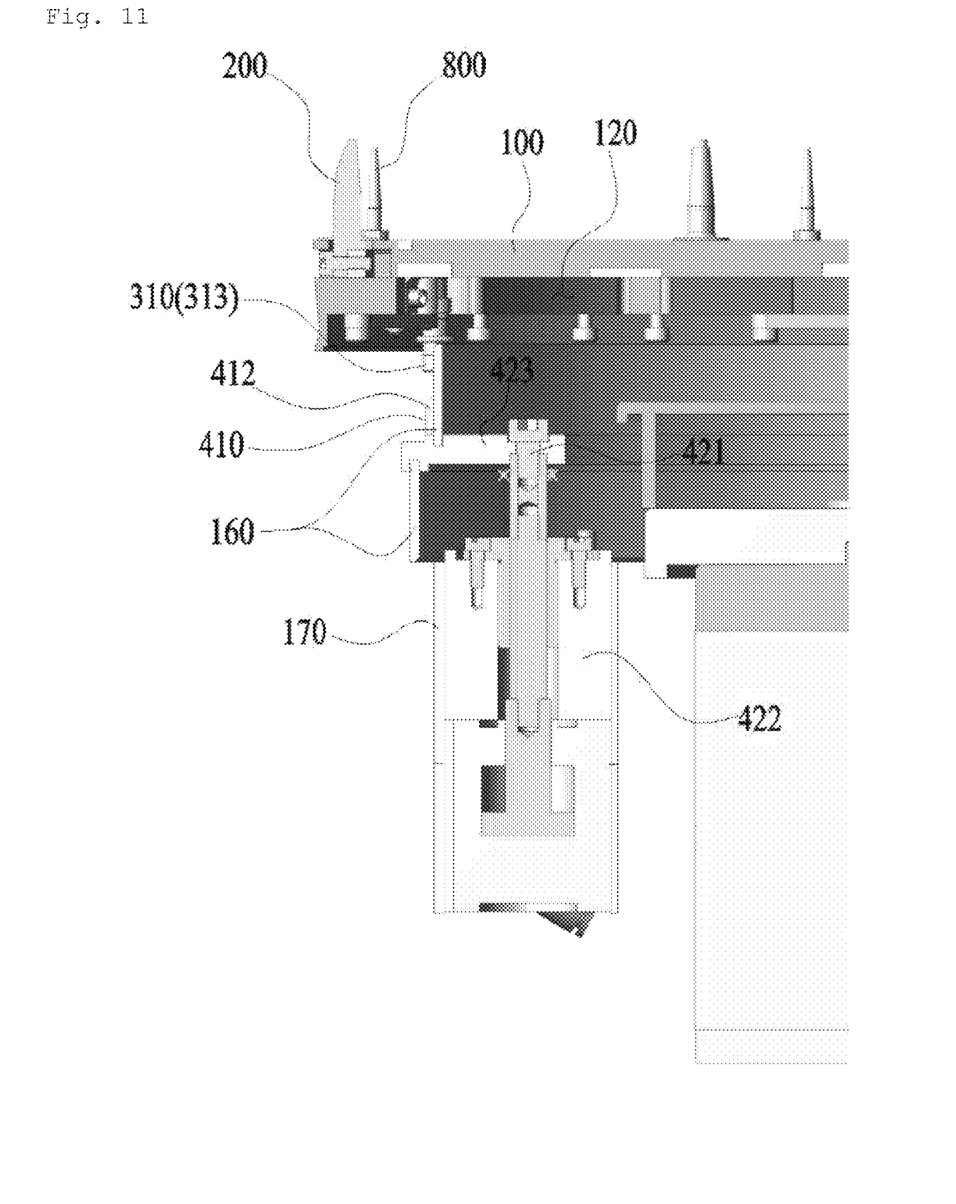
FIG. 11 is a longitudinal sectional view showing a portion of the substrate support assembly according to the present invention.

As shown in FIGS. 10 and 11, the driving unit 400 includes a pusher 410 coming into contact with the first operating piece 310 of the mechanism unit 300 and a driver 420 connected to the pusher 410.

The pusher 410 is ascended by the operation of the driver 420 to move up the first operating piece 310.

In this case, the first operating piece 310 has a connection groove 312 formed on the underside thereof, and the pusher 410 has an operating protrusion 412 protruding from top thereof and coupled to the connection groove 312 of the first operating piece 310.

Through the coupling between the connection groove 312 and the operating protrusion 412, the pusher 410 can be slidingly coupled to the first operating piece 310 with ease even if the axes of the centers of the connection groove 312 and the operating protrusion 412 do not correspond to each other.

The first operating piece 310 includes a first portion 313 coming into contact with the pusher 410 and a second portion 314 coming into contact with the slant surface 322 of the second operating piece 320.

As shown in FIGS. 6 and 7, the first portion 313 and the second portion 314 are formed on both ends of a 'I'-shaped bent plate 315 of the first operating piece 310. Accordingly, the connection groove 312 is formed on the first portion 313, and the second portion 314 comes into contact with the slant surface 322 of the second operating piece 320.

Moreover, the second operating piece 320 has a protrusion 328 extended upwardly from one longitudinal point thereof, and the second spring 321 is placed between the inner side of the protrusion 328 and the inner surface of the installation accommodation portion 110 to apply an elastic restoring force.

Further, as shown in FIG. 10, the driver 420 includes a support frame 423 with the plurality of the pushers 410 disposed thereon in the circumferential direction thereof, a pressurizing rod 421 connected to the support frame 423 and spaced apart from the pusher 410 inwardly, and a driving source 422 spaced apart from the pusher 410 inwardly and connected to the pressurizing rod 421, and desirably, a curtain wall 160 is disposed between the pusher 410 and the pressurizing rod 421.

Under the above-mentioned configuration, mist such as a chemical liquid generated during the rotation of the chuck base 100 is prevented from being introduced into the driving source 422 or the pressurizing rod 421 and thus avoided from being influenced badly thereby.

Further, a housing 170 is additionally disposed to seal the driving source 422, and the driving source 422 and the pressurizing rod 421 are connected to each other through top of the housing 170 to prevent the driving source 422 from being damaged by external influences such as mist.

In addition, as shown in FIG. 2, the chuck pins 200, the second operating pieces 320, a conductive medium 180 constituting the chuck base 100, and a motor 500 for rotating the chuck base 100 are electrically connected and grounded (wherein a ground terminal is connected to the motor 500), so that the generation of an electrostatic force from the substrate W is prevented to thus keep the quality of a product from being influenced badly by the electrostatic force.

The second operating pieces 320 and the conductive medium 180 may be made of a conductive material such as a conductive metal or a conductive material containing carbon.

A reference symbol B of FIG. 2 indicates a bolt fastened to the motor 500.

Further, as shown in FIG. 10, if two or more sets of assemblies each having the chuck pin 200, the mechanism unit 300 and the driving unit 400 are equally spaced apart from one another around the rotating shaft A in the circumferential direction of the chuck base 100, they can balancedly support the substrate W.

As described above, the substrate support assembly for the substrate treatment apparatus according to the present invention is configured to have the chuck base disposed opposite to the substrate when the substrate is installed, rotatable around the rotating shaft, and having the installation accommodation portion formed in the lower portion near the outer peripheral surface thereof in a circumferential direction thereof, the chuck pins disposed on top of the chuck base and movable along directions away from and approaching the substrate, the mechanism unit disposed in the installation accommodation portion and connected to the chuck pins to move the chuck pins, and the driving unit for transmitting power to the mechanism unit, so that as the mechanism unit is intensively disposed in the installation accommodation portion formed in the lower portion near the outer peripheral surface of the chuck base in the circumferential direction of the chuck base, a plurality of electrical and electronic parts or mechanical parts for performing various functions can be compactedly built in the inner space of the chuck base surrounded by the installation accommodation portion, in a plane view.

According to the present invention, further, the mechanism unit is configured to have the first operating piece returnably movable in the direction of the rotating shaft by means of the driving unit and the second operating piece having one side coming into contact with the first operating piece along the longitudinal direction thereof, allowing the chuck pin to be disposed on the other side thereof, and returnably moving around the hinge shaft disposed on the chuck base between one side and the other side thereof, so that if the driving unit operates to move the first operating piece, the second operating piece coming into contact with the first operating piece moves, and accordingly, the chuck pin connected to the second operating piece moves to the direction becoming distant from the substrate and thus stays at its standby position or moves to the direction approaching the substrate and thus stays at its holding position. Under the simple structure, that is, the chuck pin moves between the standby position and the holding position to minimize the cross-sectional area (volume) of the installation accommodation portion.

According to the present invention, moreover, the portion of the second operating piece, which is oriented toward the chuck pin from the hinge shaft, is located above the portion of the second operating piece, which is oriented toward the first operating piece from the hinge shaft, and the portion oriented toward the chuck pin is separated from the portion oriented toward the first operating piece in an up and down direction by means of the separation wall, so that if the top cover of the chuck base is open, the second operating piece is exposed to the outside, and the first operating piece is sealed under the separation wall, thereby easily achieving the exchange and maintenance of the chuck pin and ensuring that the first operating piece is not influenced by external environments.

According to the present invention, in addition, the chuck base has the checkup holes formed along the outer peripheral surface thereof to allow the portions of the second operating pieces oriented toward the chuck pins to be exposed to the outside, so that the connection states of the chuck pins can be easily checked from the outside.

According to the present invention, also, the weight of the portion of the second operating piece oriented toward the first operating piece is greater than the weight of the portion of the second operating piece oriented toward the chuck pin, and accordingly, the portion oriented toward the first operating piece has a greater moment than the portion of the second operating piece oriented toward the chuck pin from the hinge shaft through the centrifugal force generated during the rotation of the chuck base, so that the chuck pin naturally pressurizes the side periphery of the substrate by means of the application of the centrifugal force to thus allow the substrate to be more firmly held by the chuck pin during the rotation of the chuck base and thus reliably prevent the escape of the substrate from the chuck pin.

According to the present invention, further, the first operating piece has the connection groove formed on the underside thereof, and the pusher has the operating protrusion protruding from top thereof and coupled to the connection groove of the first operating piece, so that through the coupling between the connection groove and the operating protrusion, the pusher can be slidingly coupled to the first operating piece with ease even if the axes of the centers of the connection groove and the operating protrusion do not correspond to each other.

According to the present invention, moreover, each driving unit is configured to have the pusher coming into contact with the first operating piece of the mechanism unit and the driving unit connected to the pusher, the driving unit including the support frame with the pusher disposed thereon in the circumferential direction thereof, the pressurizing rod connected to the support frame and spaced apart from the pusher inwardly, and the driving source spaced apart from the pusher inwardly and connected to the pressurizing rod, and between the pusher and the pressurizing rod is disposed the curtain wall, so that mist such as a chemical liquid generated during the rotation of the chuck base is prevented from being introduced into the driving source or the pressurizing rod to avoid the driving source or the pressurizing rod from being influenced badly thereby.

According to the present invention, further, the chuck pins, the second operating pieces, the conductive medium constituting the chuck base, the motor for rotating the chuck base are electrically connected and thus grounded, so that the generation of an electrostatic force from the substrate is prevented to thus keep the substrate from being charged.

According to the present invention, further, two or more sets of assemblies each having the chuck pin, the mechanism unit, and the driving unit are equally spaced apart from one another around the rotating shaft, so that they can balancedly support the substrate.

The present invention may be modified in various ways and may have several exemplary embodiments. It is therefore intended that the scope of the invention be limited not by this detailed description, but rather by the claims appended hereto, and it should be understood that the invention covers all the modifications, equivalents, and replacements within the idea and technical scope of the invention.

What is claimed is:

1. A substrate support assembly for a substrate treatment apparatus, comprising:
    a chuck base disposed opposite to a substrate when the substrate is installed, rotatable around a rotating shaft, and having an installation accommodation portion formed in the lower portion near the outer peripheral surface thereof in a circumferential direction thereof;
    chuck pins disposed on top of the chuck base and movable along directions away from and approaching the substrate;
    a mechanism unit disposed in the installation accommodation portion and connected to each of the chuck pins to move each of the chuck pins; and
    a driving unit for transmitting power to the mechanism unit,
    wherein the mechanism unit comprises:
        a first operating piece returnably movable in a direction of the rotating shaft by means of the driving unit; and
        a second operating piece having one side coming into contact with the first operating piece along a longitudinal direction thereof, allowing each of the chuck pins to be disposed on the other side thereof, and returnably moving around a hinge shaft disposed on the chuck base between one side and the other side thereof,
        wherein between the first operating piece and the chuck base is disposed a first spring applying a restoring force or a first magnet applying a magnetic force in a direction of the first operating piece and the chuck base away from each other along the rotating shaft, and between the second operating piece and the chuck base is disposed a second spring applying a restoring force or a second magnet applying a magnetic force so that each of the chuck pins moves to a holding position.

2. The substrate support assembly according to claim 1, wherein the width of the installation accommodation portion in a radial direction of the substrate is set within the range of $\frac{1}{5}$ to $\frac{1}{3}$ of the radius of the substrate.

3. The substrate support assembly according to claim 1, wherein two or more sets of assemblies each having each of the chuck pins, the mechanism unit, and the driving unit are equally spaced apart from one another around the rotating shaft.

4. The substrate support assembly according to claim 1, wherein the second operating piece has a slant surface formed on the underside of one side coming into contact with the first operating piece, and as the first operating piece moves up in the direction of the rotating shaft, the second operating piece moves around the hinge shaft.

5. The substrate support assembly according to claim 1, wherein a portion of the second operating piece, which is oriented toward each of the chuck pins from the hinge shaft, is located above a portion of the second operating piece, which is oriented toward the first operating piece from the hinge shaft, and the portion oriented toward each of the chuck pins is separated from the portion oriented toward the first operating piece in an up and down direction by means of a separation wall.

6. The substrate support assembly according to claim 1, wherein in a plan view, the second operating piece is extended to the shape of an arch along the circumferential direction of the chuck base.

7. The substrate support assembly according to claim 1, wherein the first operating piece is movable up and down along two guide rods disposed vertically in the installation accommodation portion, and any one of the two guide rods is surrounded with the first spring.

8. The substrate support assembly according to claim 1, wherein the chuck pins, second operating pieces, a conductive medium constituting the chuck base, and a motor for rotating the chuck base are electrically connected to one another.

9. The substrate support assembly according to claim 5, wherein the chuck base has checkup holes formed along the outer peripheral surface thereof to allow the portion oriented toward each of the chuck pins to be exposed to the outside.

10. The substrate support assembly according to claim 5, wherein a weight of the portion oriented toward the first operating piece is greater than a weight of the portion oriented toward each of the chuck pins.

11. The substrate support assembly according to claim 5, wherein the portion of the second operating piece oriented toward the first operating piece has an auxiliary weight attached thereto with a higher density than the second operating piece, and the sum of the weight of the portion oriented toward the first operating piece and the weight of the auxiliary weight is larger than the weight of the portion oriented toward each of the chuck pins.

12. The substrate support assembly according to claim 10, wherein inside the installation accommodation portion or on the separation wall is disposed a stopper opposed laterally to the portion oriented toward each of the chuck pins in the radial direction of the chuck base.

13. The substrate support assembly according to claim 11, wherein on the chuck base or the separation wall is disposed a stopper facing the portion of the second operating piece oriented toward each of the chuck pins in a lateral direction in the radial direction of the chuck base.

14. The substrate support assembly according to claim 1, wherein the driving unit comprises:
    a pusher coming into contact with the mechanism unit; and
    a driver connected to the pusher.

15. The substrate support assembly according to claim 14, wherein the first operating piece has a connection groove formed on the underside thereof, and the pusher has an operating protrusion protruding from top thereof and coupled complementarily to the connection groove of the first operating piece.

16. The substrate support assembly according to claim 14, wherein the driver comprises:
    a support frame with pushers disposed thereon in the circumferential direction thereof;
    a pressurizing rod connected to the support frame and spaced apart from the pushers inwardly; and
    a driving source spaced apart from the pushers inwardly and connected to the pressurizing rod, and
    between the pushers and the pressurizing rod is disposed a curtain wall.

17. The substrate support assembly according to claim 16, wherein the driving source is hermetically encased by a housing and connected to the pressurizing rod through top of the housing.

* * * * *